United States Patent
Do et al.

(10) Patent No.: US 10,043,716 B2
(45) Date of Patent: Aug. 7, 2018

(54) N-WELL/P-WELL STRAP STRUCTURES

(71) Applicant: Altera Corporation, San Jose, CA (US)

(72) Inventors: Dustin Do, Morgan Hill, CA (US); Andy L. Lee, San Jose, CA (US); Giles V. Powell, Alameda, CA (US); Bradley Jensen, San Jose, CA (US); Swee Aun Lau, Simpang Ampat (MY); Wuu-Cherng Lin, San Jose, CA (US); Thomas H. White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/243,732

(22) Filed: Aug. 22, 2016

(65) Prior Publication Data
US 2016/0358825 A1 Dec. 8, 2016

Related U.S. Application Data

(63) Continuation of application No. 13/814,590, filed as application No. PCT/US2011/001378 on Aug. 4, 2011, now Pat. No. 9,449,962, which is a continuation of application No. 12/851,805, filed on Aug. 6, 2010, now Pat. No. 8,217,464.

(51) Int. Cl.
| | |
|---|---|
| H01L 21/8234 | (2006.01) |
| H01L 21/3205 | (2006.01) |
| H01L 21/762 | (2006.01) |
| H01L 27/02 | (2006.01) |
| H01L 21/8238 | (2006.01) |
| H01L 29/78 | (2006.01) |

(52) U.S. Cl.
CPC ........ *H01L 21/823493* (2013.01); *H01L 21/32055* (2013.01); *H01L 21/76224* (2013.01); *H01L 21/823475* (2013.01); *H01L 21/823481* (2013.01); *H01L 27/0207* (2013.01); *H01L 21/823871* (2013.01); *H01L 21/823892* (2013.01); *H01L 29/7833* (2013.01)

(58) Field of Classification Search
CPC ............................................. H01L 21/823493
See application file for complete search history.

(56) References Cited

U.S. PATENT DOCUMENTS

| | | | |
|---|---|---|---|
| 6,501,138 B1 | 12/2002 | Karasawa | |
| 7,234,069 B1 * | 6/2007 | Johnson | G11C 5/025 713/400 |
| 7,586,147 B2 | 9/2009 | Liaw | |
| 7,679,119 B2 | 3/2010 | Roizin et al. | |
| 8,217,464 B2 | 7/2012 | Do et al. | |
| 8,692,336 B2 | 4/2014 | Tamaru | |
| 9,224,438 B2 * | 12/2015 | Lee | G11C 7/10 |

(Continued)

FOREIGN PATENT DOCUMENTS

WO   WO/2011/077664   5/2013

OTHER PUBLICATIONS

European Patent Office, European Search Report and Opinion for European Patent Application EP 11 81 4194.5, dated Oct. 7, 2016.

*Primary Examiner* — Moazzam Hossain

(57) ABSTRACT

Embodiments of N-well or P-well strap structures are disclosed with lower space requirements achieved by forming the strap on both sides of one or more floating polysilicon gate fingers.

18 Claims, 4 Drawing Sheets

(56) References Cited

U.S. PATENT DOCUMENTS

| | | | |
|---|---|---|---|
| 2004/0080982 A1* | 4/2004 | Roizin | G11C 16/0441 |
| | | | 365/185.28 |
| 2005/0056881 A1* | 3/2005 | Yeo | H01L 21/28052 |
| | | | 257/315 |
| 2005/0076320 A1 | 4/2005 | Maeda | |
| 2006/0131609 A1 | 6/2006 | Kinoshita et al. | |
| 2007/0004147 A1 | 1/2007 | Toubou et al. | |
| 2011/0074035 A1* | 3/2011 | Yune | H01L 21/76816 |
| | | | 257/773 |
| 2011/0101348 A1* | 5/2011 | Tokashiki | H01L 22/14 |
| | | | 257/48 |

* cited by examiner

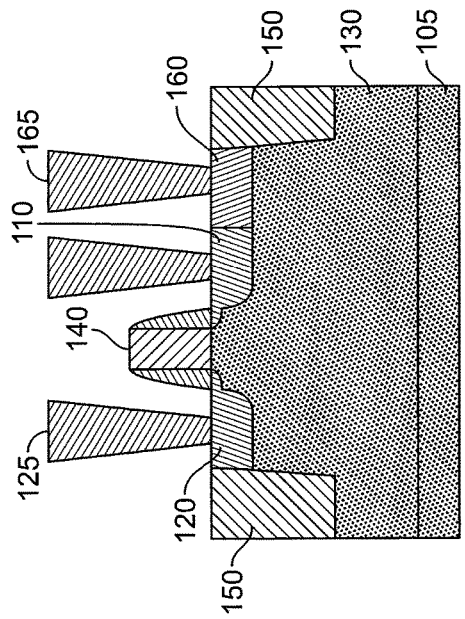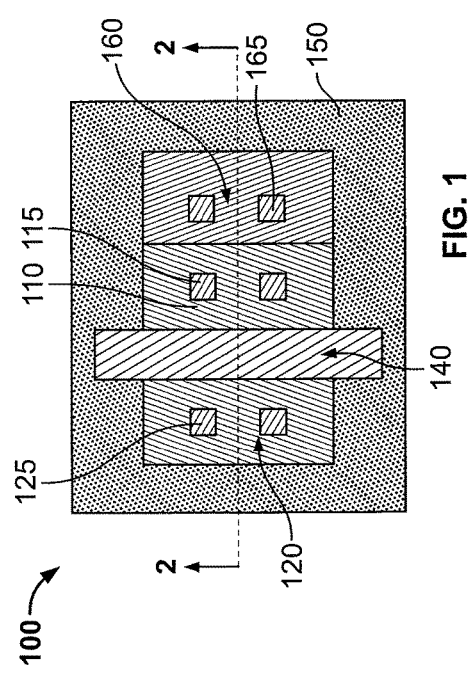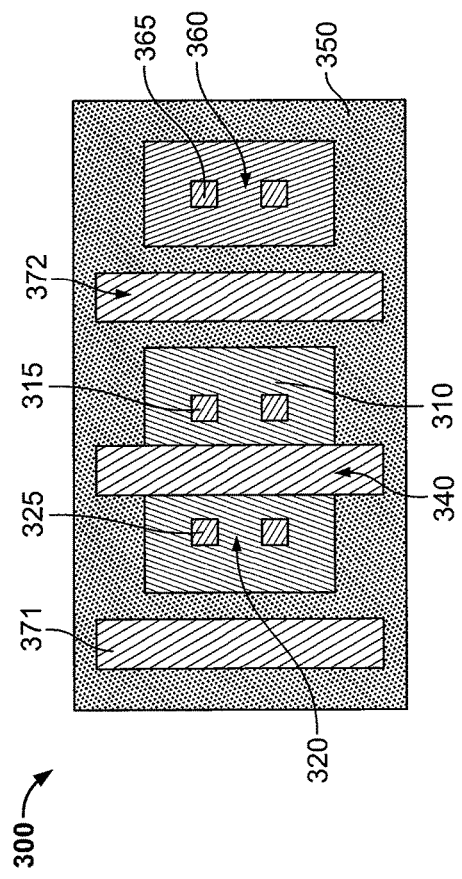

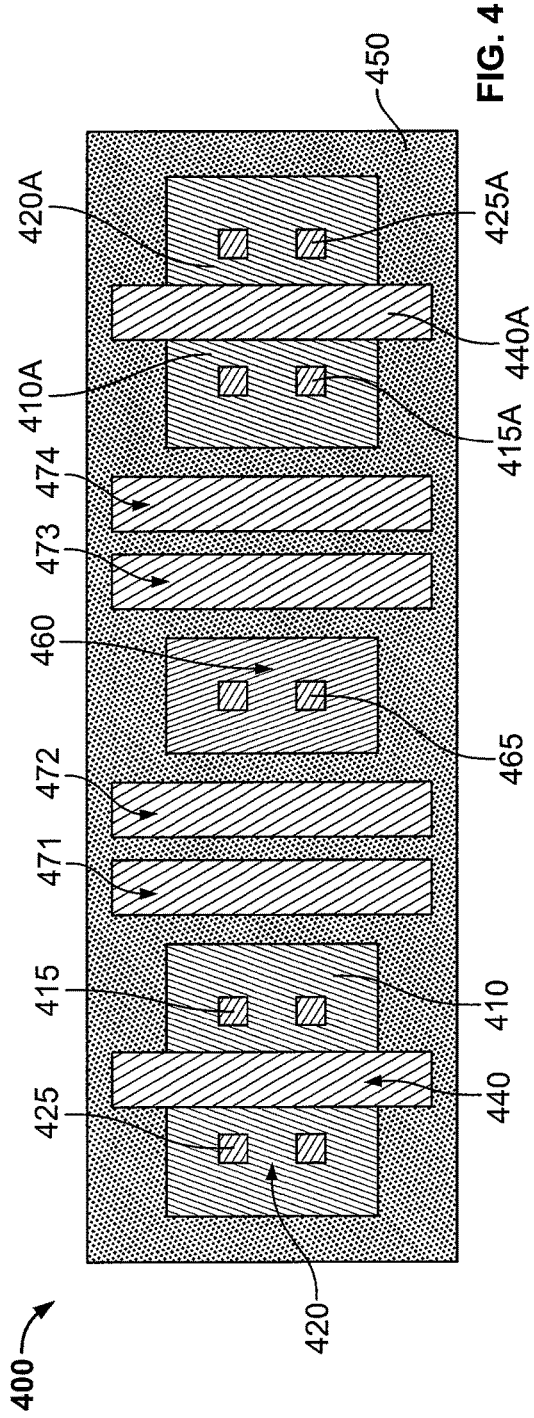
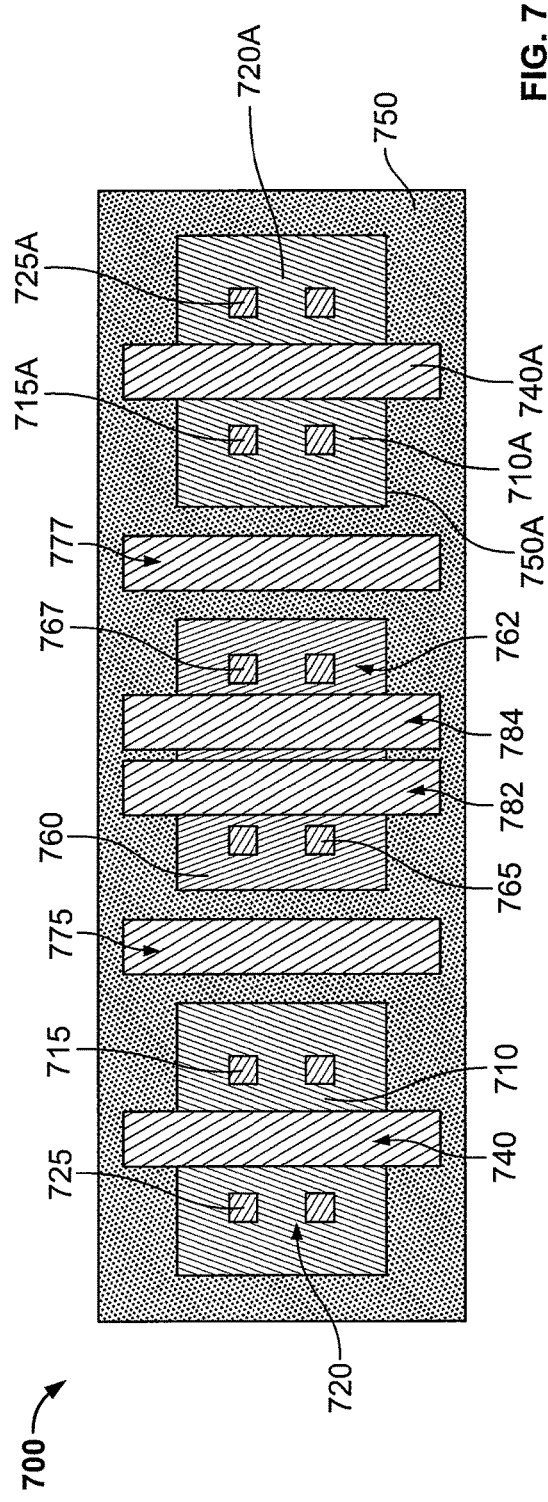

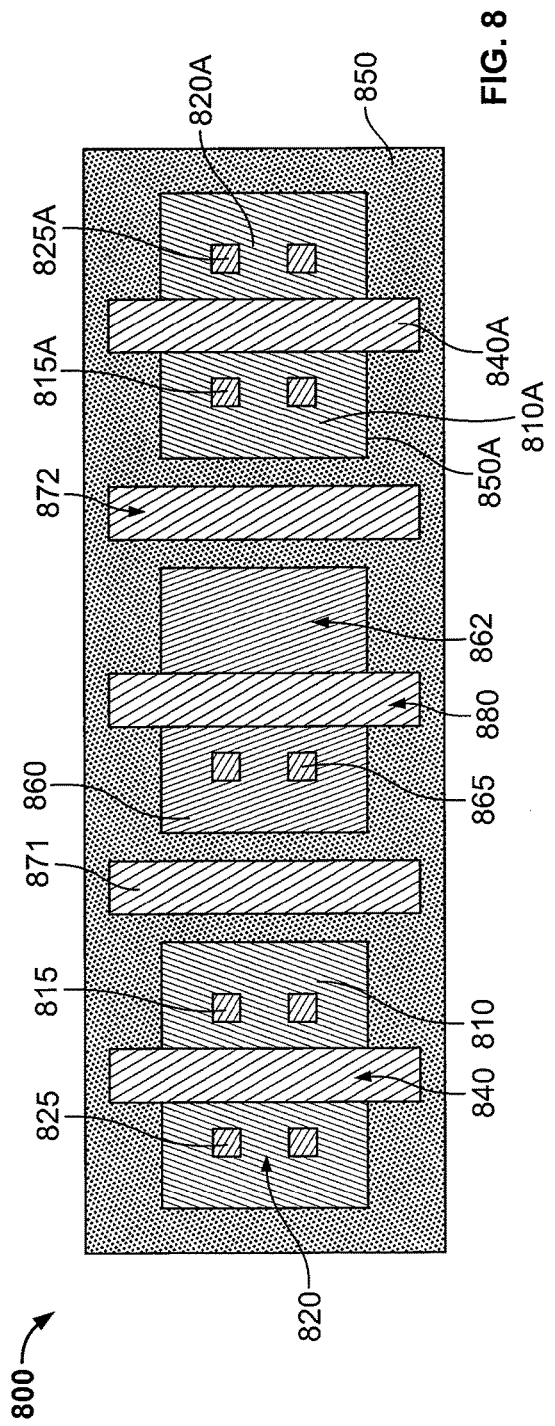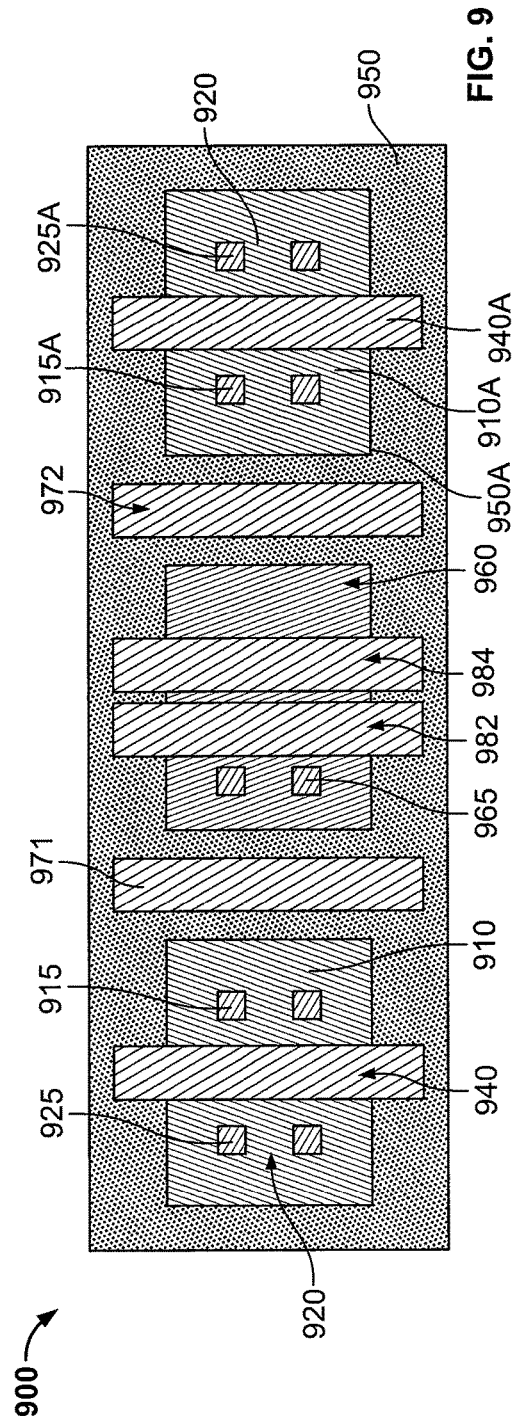

N-WELL/P-WELL STRAP STRUCTURES

BACKGROUND OF THE INVENTION

This relates to N-well or P-well strap structures for use in integrated circuits.

N-well or P-well strap structures are typically used in integrated circuits to tie a source line to a well region so as to assure that the voltage in the well region is the same as the voltage at the source line.

FIGS. 1 and 2 depict a top view and a cross-section along lines 2-2 of FIG. 1 of a typical integrated circuit structure 100 that includes an active device and a well strap formed in a well in a semiconductor substrate 105 It will be understood that this structure may be replicated multiple times in the integrated circuit. Structure 100 includes source and drain regions 110, 120 formed in a well 130 with a polysilicon gate finger 140 formed on a dielectric layer (not shown) on the surface of well 130. These elements will be recognized as forming a MOS transistor; but it is to be understood that the MOS transistor is only illustrative of any active device. Following industry practice, the length L of gate 140 is its shorter dimension.

Structure 100 further includes diffusion region 160 that makes ohmic contact with well 130 and ohmic contacts (or taps) 115 to source region 110, ohmic contacts 125 to drain region 120, and ohmic contacts 165 to diffusion region 160. The diffusion region 160 and its contacts or taps 165 constitute the well strap. A shallow trench isolation (STI) region 150 surrounds the active device and well strap.

Illustratively, the transistor is a PMOS transistor, source and drain regions are P-type, well 130 is an N-type well, and diffusion region 160 is N-type. Alternatively, the transistor is an NMOS transistor, source and drain regions 110, 120 are N-type, and well 130 and diffusion region 160 are P-type.

In certain prior art integrated circuits, the N-well or P-well strap is placed so that it is directly abutting an active device such as the MOS transistor as shown in FIGS. 1 and 2. Further details concerning such an implementation of a N-well strap may be found in U.S. Pat. No. 7,586,147 B2 for "Butted Source Contact and Well Strap," which is incorporated herein by reference. In alternative structures, the well strap may form a ring around the active device or group of active devices.

In certain other prior art integrated circuits, dummy polysilicon is placed next to the device gates so as to control uniformity of critical dimensions. In this case, the well strap is spaced apart from the active device. FIG. 3 is a top view of such a prior art integrated circuit structure 300 including an active device and a well strap. Illustratively, structure 300 includes source and drain regions 310, 320 formed in a well 330 with a polysilicon gate finger 340 formed on a dielectric layer (not shown) on the surface of well 330. These elements will be recognized as forming a MOS transistor; but it is to be understood that the MOS transistor is only illustrative of any active device. A substrate (not shown) similar to substrate 105 of FIG. 2 underlies well 330.

Structure 300 further includes diffusion region 360 that makes ohmic contact with well 330 and ohmic contacts (or taps) 315 to source region 310, ohmic contacts 325 to drain region 320, and ohmic contacts 365 to diffusion region 360. The diffusion region 360 and its contacts or taps 365 constitute the well strap. A STI region 350 surrounds the active device and the well strap. Again, the transistor can be a PMOS transistor with P-type source and drain regions 310, 320 and N-type well 330 and diffusion region 360; or the transistor can be a NMOS transistor with N-type source and drain regions 310, 320 and P-type well 330 and diffusion region 360.

Structure 300 further comprises dummy polysilicon gate fingers 371, 372 located on opposite sides of the active device above portions of the STI region 350. As a result, the well strap is separated from the active device by at least one length of the dummy polysilicon finger.

In certain other prior art integrated circuits, double dummy polysilicon is placed next to active devices. FIG. 4 is a top view of such a prior art integrated circuit structure 400 including an active device and a well strap. Illustratively, structure 400 includes on the left-hand side source and drain regions 410, 420 formed in a well 430 with a polysilicon gate finger 440 formed on a dielectric layer (not shown) on the surface of well 430. These elements will be recognized as forming a first MOS transistor; but it will be understood that the MOS transistor is only illustrative of any active device. A second MOS transistor is formed on the right-hand side of FIG. 4 and includes the same elements bearing the same numbers followed by the suffix A. Again, a substrate (not shown) similar to substrate 105 of FIG. 2 underlies well 430.

Structure 400 further includes diffusion region 460 that makes ohmic contact with well 430 and ohmic contacts (or taps) 415 to source region 410, ohmic contacts 425 to drain region 420, and ohmic contacts 465 to diffusion region 460. The diffusion region 460 and its contacts or taps 465 constitute the well strap. A STI region 450 surrounds the active devices and the well strap. Again, the transistor can be a PMOS transistor with P-type source and drain regions 410, 420 and N-type well 430 and diffusion region 460; or the transistor can be a NMOS transistor with N-type source and drain regions 410, 420 and P-type well 430 and diffusion region 460.

Structure 400 further comprises dummy polysilicon gate fingers 471, 472, 473, 474 with the first two fingers 471, 472 located above portions of STI region 450 between the well strap and the first transistor and the second two fingers 473, 474 being located above other portions of STI regions 450 between the well strap and the second transistor. As a result, the well strap is separated from the active device by at least two lengths of the dummy polysilicon fingers.

SUMMARY OF THE INVENTION

The use of increasing numbers of dummy polysilicon gate fingers to separate the active device(s) from the well strap takes up considerable amount of space on the semiconductor substrate. The present invention is improved N-well or P-well strap structures with lower space requirements. In illustrative embodiments, reduced space requirements are achieved by forming the strap on both sides of one or more floating polysilicon gate fingers.

BRIEF DESCRIPTION OF THE DRAWINGS

These and other objects and advantages of the present invention will be apparent to those of ordinary skill in the art in view of the following Detailed Description in which:

FIGS. 1 and 2 are a top view and a cross-sectional view of a first well strap structure of the prior art;

FIG. 3 is a top view of a second prior art well strap structure;

FIG. 4 is a top view of a third prior art well strap structure;

FIG. 7 is a top view of a second illustrative embodiment of the invention;

FIG. 8 is a top view of a third illustrative embodiment of the invention; and FIG. 9 is a top view of a fourth illustrative embodiment of the invention.

DETAILED DESCRIPTION

Figure 5:
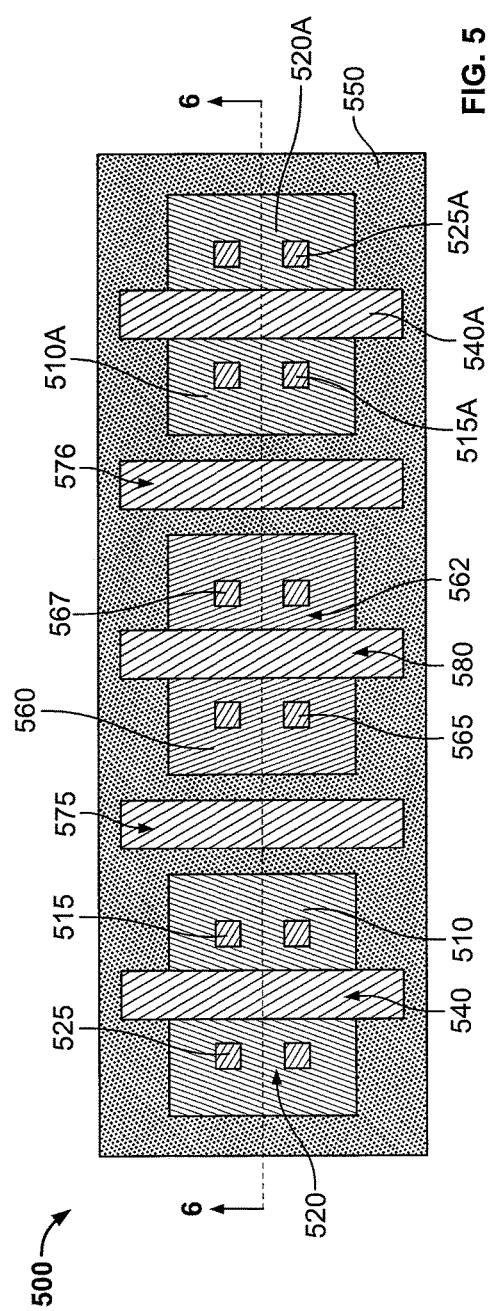
FIGS. 5 and 6 are a top view and a cross-sectional view of a first illustrative embodiment of the invention.
Figure 6:
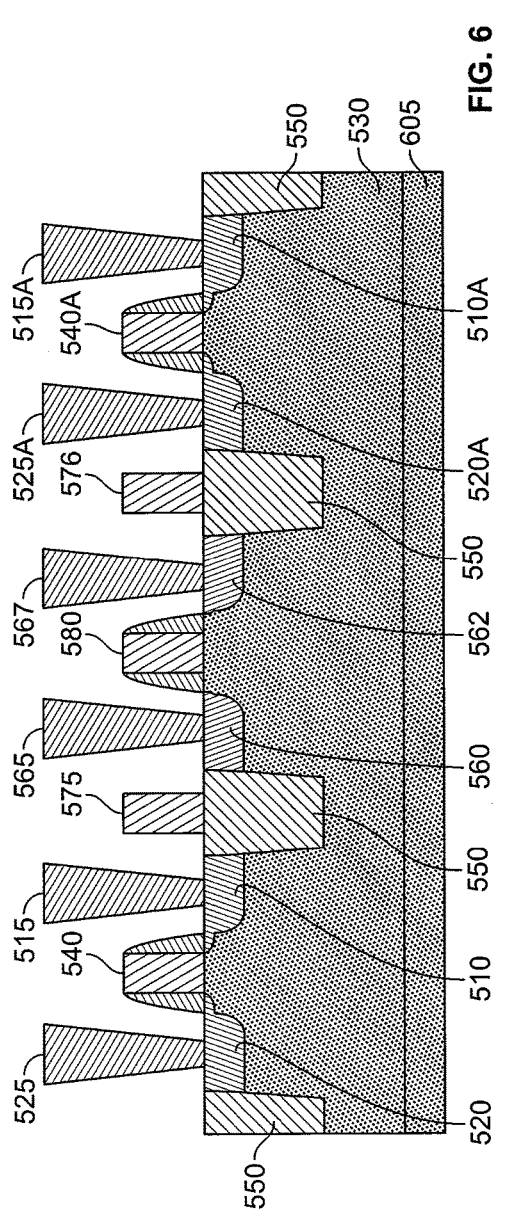

FIGS. 5 and 6 are a top view and a cross-sectional view of a first illustrative embodiment of the invention. Structure 500 includes source and drain regions 510, 520 formed in a well 530 with a polysilicon gate finger 540 formed on a dielectric layer (not shown) on the surface of well 530. These elements will be recognized as forming a MOS transistor; but it will be understood that the MOS transistor is only illustrative of any active device that may be used in the practice of the invention. A second MOS transistor is formed on the right-hand side of FIG. 5 and includes the same elements bearing the same numbers followed by the suffix A. As shown in FIG. 6, a semiconductor substrate 605 underlies well 530.

Structure 500 further includes diffusion regions 560, 562 that make ohmic contact with well 530, a floating polysilicon gate finger 580 between diffusion regions 560, 562, and ohmic contacts (or taps) 515 to source region 510, ohmic contacts 525 to drain region 520, and ohmic contacts 565, 567 to diffusion regions 560, 562. The diffusion regions 560, 562, and contacts or taps 565, 567 constitute the well strap. A STI region 550 surrounds the active devices and the well strap. As shown in FIG. 5, taps 565 and taps 567 are on opposite sides of floating gate finger 580. While two taps 565 and two taps 567 are shown, a single tap 565 or 567 or more than two taps 565 or 567 may be used.

Structure 500 further comprises dummy polysilicon gate fingers 575, 576 located on opposite sides of diffusion regions 560, 562 and above portions of STI region 550. As a result, the well strap is separated from the active device by only one length of the dummy polysilicon gate finger, thereby reducing the distance between the active device and the diffusion region 560 compared with the distance between the active device and the diffusion region 460 in the prior art structure of FIG. 4.

To form structure 500, dopants of a first conductivity-type, illustratively N-type, are first implanted in a substrate 602 of a second conductivity type, illustratively P-type, to form an N-type well 530. STI region 550 is then formed in well 530. An insulating layer is then formed on the surface of the well; and polysilicon gate fingers 540, 540A, 575, 576, 580 are formed on the insulating layer. Lightly doped drain regions are then formed in the well on each side of gates 540, 540A; and sidewalls 542, 542A are then formed on the sides of gates 540, 540A. The gates and sidewalls are then used as masks to control the implantation of dopants during formation of the source and drain regions and the diffusion regions. Illustratively P-type dopants are implanted on both sides of gates 540, 540A and sidewalls 542, 542A to form source regions 510, 510A and drain regions 520, 520A of the PMOS transistors; and N-type dopants are implanted on both sides of gate finger 580 to form diffusion regions 560, 562. Because the gates and sidewalls shield the well regions directly underneath them, these well regions are not doped during the implantation process with the result that separate source and drain regions and separate diffusion regions 560, 562 are formed. Holes are then made in the insulating layer and contacts are formed to the source and drain regions 510, 510A, 520, 520A and the diffusion regions 560, 562. Advantageously, the N-type diffusion regions 560, 562 may be formed at the same time as the same process is used to form other N-type regions, such as source and drain regions, elsewhere on the integrated circuit; and similarly, the P-type process used to form the P-type source and drain regions 510, 510A, 520, 520A may be used to form P-type diffusion regions elsewhere on the integrated circuit.

FIG. 7 is a top view of a second illustrative embodiment of the invention. Structure 700 includes source and drain regions 710, 720 formed in a well (not shown) with a polysilicon gate finger 740 formed on a dielectric layer (not shown) on the surface of the well. These elements will be recognized as forming a MOS transistor; but it will be understood that the MOS transistor is only illustrative of any active device that may be used in the practice of the invention. A second MOS transistor is formed on the right-hand side of FIG. 7 and includes the same elements bearing the same numbers followed by the suffix A. The well is formed in a semiconductor substrate (not shown); and the cross-section of the active device, well and substrate of the embodiment of FIG. 7 is similar to the cross-section of the active device, well 630 and substrate 605 of FIG. 6.

Structure 700 further includes diffusion regions 760, 762, 764 that make ohmic contact with well 730, at least two floating polysilicon gate fingers 782, 784 between diffusion regions 760, 762 and ohmic contacts (or taps) 715 to source region 710, ohmic contacts 725 to drain region 720, and ohmic contacts 765, 767 to diffusion regions 760, 762. No contacts are made to diffusion region 764 with the result that region 764 is left floating. The diffusion regions 760, 762, and contacts or taps 765, 767 constitute the well strap. A STI region 750 surrounds the active devices and the well strap. As shown in FIG. 7, taps 765 and taps 767 are on opposite sides of floating gate fingers 782, 784.

Structure 700 further comprises dummy polysilicon gate fingers 775, 777 located on opposite sides of the active device and above portions of the STI region 750. As a result, the well strap is separated from the active device by only one length of the dummy polysilicon gate finger, thereby reducing the distance between the active device and the diffusion region compared to prior art structures.

The process for forming structure 700 and the resulting structural cross-section are substantially the same as those of structure 500 except that two floating polysilicon gate fingers 782, 784 are used instead of a single polysilicon gate finger 580 with the result that three diffusion regions 760, 762, 764 are formed instead of two.

FIG. 8 is a top view of a third illustrative embodiment of the invention. Structure 800 includes source and drain regions 810, 820 formed in a well (not shown) with a polysilicon gate finger 840 formed on a dielectric layer (not shown) on the surface of the well. These elements will be recognized as forming a MOS transistor; but it will be understood that the transistor is only illustrative of any active device that may be used in the practice of the invention. A second MOS transistor is formed on the right-hand side of FIG. 8 and includes the same elements bearing the same numbers followed by the suffix A. Again, the well is formed in a semiconductor substrate (not shown); and the cross-section of the active device, well and substrate of the embodiment of FIG. 8 is similar to the cross-section of the active device, well 630 and substrate 605 of FIG. 6.

Structure 800 further includes diffusion regions 860, 862 that make ohmic contact with well 830, a floating polysilicon gate finger 880 between diffusion regions 860, 862 and ohmic contacts (or taps) 815 to source region 810, ohmic contacts 825 to drain region 820, and ohmic contacts 865 to diffusion region 860. As shown in FIG. 8, the contacts 865 to diffusion region are located on only one side of the floating polysilicon gate finger 880 with the result that diffusion region 862 is left floating. The diffusion region 860 and contacts or taps 865 constitute the well strap. A STI region 850 surrounds the active devices and the diffusion regions.

Structure 800 further comprises dummy polysilicon gate fingers 871, 872 located on opposite sides of the active device and above the diffusion regions. As a result, the well strap is separated from the active device by only one length of the dummy polysilicon gate finger; and the size of diffusion region 862 is reduced by eliminating the taps on one side of the floating gate finger.

The process for forming structure 800 and the resulting structural cross-section are substantially the same as those of structure 500 except that contacts to the diffusion region are formed on only one side of the floating polysilicon gate finger 880.

FIG. 9 is a top view of a fourth illustrative embodiment of the invention. Structure 900 includes source and drain regions 910, 920 formed in a well (not shown) with a polysilicon gate finger 940 formed on a dielectric layer (not shown) on the surface of the well. These elements will be recognized as forming a MOS transistor; but it will be understood that the MOS transistor is only illustrative of any active device that may be used in the practice of the invention. A second MOS transistor is formed on the right-hand side of FIG. 9 and includes the same elements bearing the same numbers followed by the suffix A. Again, the well is formed in a semiconductor substrate (not shown); and the cross-section of the active device, well and substrate of the embodiment of FIG. 9 is similar to the cross-section of the active device, well 630 and substrate 605 of FIG. 6.

Structure 900 further includes diffusion regions 960, 962, 964 that make ohmic contact with well 930, at least two floating polysilicon gate fingers 982, 984 between diffusion regions 960, 962, 964, and ohmic contacts (or taps) 915 to source region 910, ohmic contacts 925 to drain region 920, and ohmic contacts 965 to diffusion region 960. As shown in FIG. 9, the contacts 965 to diffusion region 960 are located on only one side of the floating polysilicon gate fingers 982, 984 with the result that diffusion regions 962, 964 are left floating. The diffusion region 960 and contacts or taps 965 constitute the well strap. A STI region 950 surrounds the active devices and the well strap.

Structure 900 further comprises dummy polysilicon gate fingers 971, 972 located on opposite sides of the active device and above portions of the STI regions. As a result, the well strap is separated from the active device by only one length of the dummy polysilicon gate finger; and the size of the diffusion region is reduced by eliminating the contacts on one side.

The process for forming structure 900 and the resulting structural cross-section are substantially the same as those of structure 700 except that contacts to the diffusion region are made on only one side of the floating polysilicon gate fingers 982, 984.

As will be apparent to those skilled in the art, numerous variations may be practiced within the spirit and scope of the present invention. For example, the well and diffusion region can be either a P-type well and diffusion region or an N-type well and diffusion region. If the active device is a transistor, it can be an NMOS transistor in a P-well or a PMOS transistor in an N-well. Other active devices may also be used in the practice of the invention. For purposes of illustration, the contacts or taps have been depicted as a pair of contacts; but the invention may be practiced with a single contact or with more than two contacts. Other modifications will be apparent to those skilled in the art.

What is claimed is:

1. A method comprising:
   forming a well in a semiconductor substrate;
   forming a first active device in the well;
   forming a strap in the well and separated from the first active device, wherein the strap comprises first and second diffusion regions on opposite sides of a floating polysilicon finger, and wherein the strap further comprises first and second taps that connect respectively to the first and second diffusion regions on opposite sides of the floating polysilicon finger;
   forming a first dummy polysilicon finger between the first active device and the strap;
   forming a second active device in the well on an opposite side of the strap from the first active device; and
   forming a second dummy polysilicon finger between the second active device and the strap.

2. The method of claim 1, wherein the first active device is an MOS transistor.

3. The method of claim 1 further comprising:
   forming a shallow trench isolation region that surrounds the first active device and the strap.

4. The method of claim 3, wherein the shallow trench isolation region surrounds the second active device.

5. The method of claim 1, wherein the first active device comprises a first polysilicon gate finger, and wherein the second active device comprises a second polysilicon gate finger.

6. The method of claim 5, wherein the first active device further comprises first source and drain regions, and wherein the second active device further comprises second source and drain regions.

7. The method of claim 1 further comprising:
   forming a shallow trench isolation region, wherein the first and second dummy polysilicon fingers are located above portions of the shallow trench isolation region.

8. The method of claim 1, wherein the well is doped with N-type dopants.

9. The method of claim 2, wherein the second active device is an MOS transistor.

10. A method comprising:
    forming a well in a semiconductor substrate;
    forming a first active device in the well;
    forming a strap in the well and separated from the first active device, wherein the strap comprises a diffusion region, a floating polysilicon finger, and a tap connecting to the diffusion region on one side of the floating polysilicon finger;
    forming a first dummy polysilicon finger on the well between the first active device and the strap;
    forming a second active device in the well on an opposite side of the strap from the first active device; and
    forming a second dummy polysilicon finger on the well between the second active device and the strap.

11. The method of claim 10, wherein the first active device is an MOS transistor.

12. The method of claim 10, wherein a plurality of taps connect to the diffusion region.

13. The method of claim 10 further comprising:
    forming a shallow trench isolation region surrounding the first active device and the strap.

14. The method of claim 13, wherein the shallow trench isolation region surrounds the second active device.

15. The method of claim 10, wherein the first active device comprises a first polysilicon gate finger, and wherein the second active device comprises a second polysilicon gate finger.

16. The method of claim 15, wherein the first active device further comprises first source and drain regions, and wherein the second active device further comprises second source and drain regions.

17. The method of claim 10 further comprising:
    forming a shallow trench isolation region, wherein the first and second dummy polysilicon fingers are located above portions of the shallow trench isolation region.

18. The method of claim 11, wherein the second active device is an MOS transistor.

* * * * *